(12) United States Patent
Chang et al.

(10) Patent No.: US 8,715,822 B2
(45) Date of Patent: May 6, 2014

(54) COATED ARTICLE AND METHOD FOR MAKING THE SAME

(75) Inventors: Hsin-Pei Chang, New Taipei (TW);
Wen-Rong Chen, New Taipei (TW);
Huann-Wu Chiang, New Taipei (TW);
Cheng-Shi Chen, New Taipei (TW);
Xiao-Qiang Chen, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 163 days.

(21) Appl. No.: 13/213,383

(22) Filed: Aug. 19, 2011

(65) Prior Publication Data

US 2012/0121926 A1 May 17, 2012

(30) Foreign Application Priority Data

Nov. 11, 2010 (CN) .......................... 2010 1 0539909

(51) Int. Cl.
*B32B 9/00* (2006.01)

(52) U.S. Cl.
USPC ............ 428/336; 428/469; 428/472; 428/698

(58) Field of Classification Search
USPC ................................. 428/336, 469, 472, 698
See application file for complete search history.

(56) References Cited

U.S. PATENT DOCUMENTS

| | | | | | |
|---|---|---|---|---|---|
| 3,878,871 | A | * | 4/1975 | Anthony et al. | ............. 428/654 |
| 4,431,268 | A | * | 2/1984 | Ohno et al. | .................. 428/654 |
| 4,957,822 | A | * | 9/1990 | Steeg et al. | ................... 428/653 |
| 4,973,523 | A | * | 11/1990 | Neuhaus et al. | ............. 428/653 |
| 5,268,236 | A | * | 12/1993 | Dumont et al. | ............. 428/636 |
| 6,517,954 | B1 | * | 2/2003 | Mergen et al. | ............... 428/653 |
| 8,053,087 | B2 | * | 11/2011 | Neuhaus | ........................ 428/654 |
| 2009/0181262 | A1 | * | 7/2009 | Isaksson et al. | ............. 428/626 |

* cited by examiner

*Primary Examiner* — Archene Turner
(74) *Attorney, Agent, or Firm* — Novak Druce Connolly Bove + Quigg LLP

(57) ABSTRACT

A coated article includes a substrate, an anti-corrosion layer formed on the substrate, and a decorative layer formed on the anti-corrosion layer. The substrate is made of aluminum or aluminum alloy. The anti-corrosion layer includes an aluminum layer formed on the substrate and an aluminum oxide layer formed on the aluminum layer. The coated article has improved corrosion resistance.

9 Claims, 2 Drawing Sheets

COATED ARTICLE AND METHOD FOR MAKING THE SAME

CROSS-REFERENCE TO RELATED APPLICATIONS

This application is one of the eleven related co-pending U.S. patent applications listed below. All listed applications have the same assignee. The disclosure of each of the listed applications is incorporated by reference into all the other listed applications.

| | Title | Inventors |
|---|---|---|
| 13/213,374 | COATED ARTICLE AND METHOD FOR MAKING THE SAME | HSIN-PEI CHANG et al. |
| 13/213,381 | COATED ARTICLE AND METHOD FOR MAKING THE SAME | HSIN-PEI CHANG et al. |
| 13/213,383 | COATED ARTICLE AND METHOD FOR MAKING THE SAME | HSIN-PEI CHANG et al. |
| 13/213,386 | COATED ARTICLE AND METHOD FOR MAKING THE SAME | HSIN-PEI CHANG et al. |
| 13/213,388 | COATED ARTICLE AND METHOD FOR MAKING THE SAME | HSIN-PEI CHANG et al. |
| 13/213,392 | COATED ARTICLE AND METHOD FOR MAKING THE SAME | HSIN-PEI CHANG et al. |
| 13/213,398 | COATED ARTICLE AND METHOD FOR MAKING THE SAME | HSIN-PEI CHANG et al. |
| 13/213,403 | COATED ARTICLE AND METHOD FOR MAKING THE SAME | HSIN-PEI CHANG et al. |
| 13/213,410 | COATED ARTICLE AND METHOD FOR MAKING THE SAME | HSIN-PEI CHANG et al. |
| 13/213,418 | COATED ARTICLE AND METHOD FOR MAKING THE SAME | HSIN-PEI CHANG et al. |
| 13/213,424 | COATED ARTICLE AND METHOD FOR MAKING THE SAME | HSIN-PEI CHANG et al. |

BACKGROUND

1. Technical Field

The present disclosure relates to coated articles and a method for making the coated articles.

2. Description of Related Art

Physical vapor deposition (PVD) is an environmentally friendly coating technology. Coating metal substrates using PVD is widely applied in various industrial fields.

The standard electrode potential of aluminum or aluminum alloy is very low. Thus the aluminum or aluminum alloy substrates may often suffer galvanic corrosions. When the aluminum or aluminum alloy substrate is coated with a decorative layer such as a titanium nitride (TiN) or chromium nitride (CrN) layer using PVD, the potential difference between the decorative layer and the substrate is high and the decorative layer made by PVD will often have small openings such as pinholes and cracks, which can accelerate the galvanic corrosion of the substrate.

Therefore, there is room for improvement within the art.

BRIEF DESCRIPTION OF THE FIGURE

Many aspects of the coated article and the method for making the coated article can be better understood with reference to the following drawings. The components in the drawings are not necessarily drawn to scale, the emphasis instead being placed upon clearly illustrating the principles of the coated article and the method. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
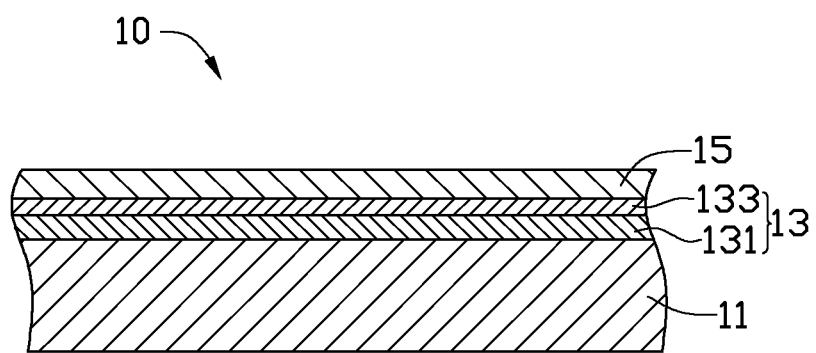
FIG. 1 is a cross-sectional view of an exemplary coated article.

FIG. 1 shows a coated article 10 according to an exemplary embodiment. The coated article 10 includes a substrate 11, an anti-corrosion layer 13 formed on the substrate 11, and a decorative layer 15 formed on the anti-corrosion layer 13. The coated article 10 may be used as a housing of a computer, communication device, or a consumer electronic device.

The substrate 11 is made of aluminum or aluminum alloy.

The anti-corrosion layer 13 includes an aluminum layer 131 formed on the substrate 11 and an aluminum oxide layer 133 formed on the aluminum layer 131. The aluminum layer 131 has a thickness of about 1.0 μm to about 3.0 μm. The aluminum oxide layer 133 has a thickness of about 0.5 μm to about 1.0 μm.

The decorative layer 15 may be colored according to choice. The decorative layer 15 may be a titanium nitride (TiN) or chromium nitride (CrN) layer. The decorative layer 15 has a thickness of about 1.0 μm to about 3.0 μm. A vacuum sputtering process may be used to form the anti-corrosion layer 13 and the decorative layer 15.

Figure 2:
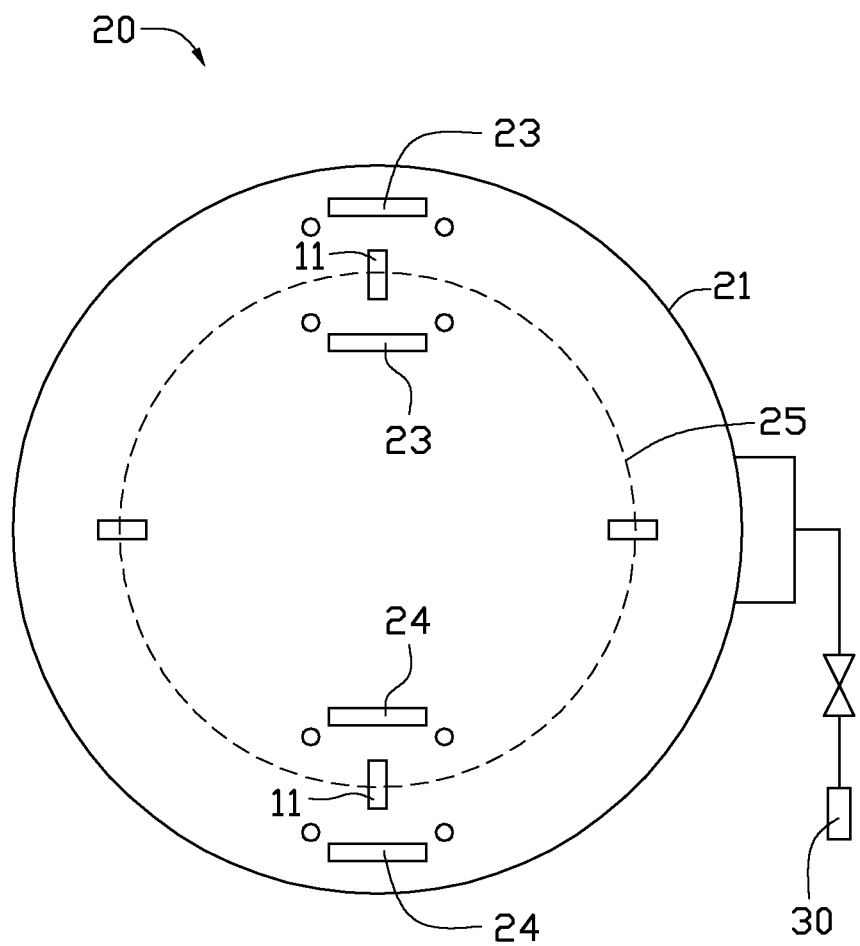
FIG. 2 is a schematic view of a vacuum sputtering device for fabricating the coated article in FIG. 1.

FIG. 2 shows a vacuum sputtering device 20, which includes a vacuum chamber 21 and a vacuum pump 30 connected to the vacuum chamber 21. The vacuum pump 30 is used for evacuating the vacuum chamber 21. The vacuum chamber 21 has aluminum targets 23, titanium or chromium targets 24 and a rotary rack (not shown) positioned therein. The rotary rack holding the substrate 11 revolves along a circular path 25, and the substrate 11 is also rotated about its own axis while being carried by the rotary rack.

A method for making the coated article 10 may include the following steps:

The substrate 11 is pretreated. The pre-treating process may include the following steps: electrolytic polishing the substrate 11; wiping the surface of the substrate 11 with deionized water and alcohol; ultrasonically cleaning the substrate 11 with acetone solution in an ultrasonic cleaner (not shown), to remove impurities such as grease or dirt from the substrate 11. Then, the substrate 11 is dried.

The substrate 11 is positioned in the rotary rack of the vacuum chamber 21 to be plasma cleaned. The vacuum chamber 21 is then evacuated to about $1.0 \times 10^{-3}$ Pa. Argon gas (abbreviated as Ar, having a purity of about 99.999%) is used as the sputtering gas and is fed into the vacuum chamber 21 at a flow rate of about 250 standard-state cubic centimeters per minute (sccm) to about 500 sccm. A negative bias voltage in a range from about −300 volts (V) to about −800 V is applied to the substrate 11. The plasma then strikes the surface of the substrate 11 to clean the surface of the substrate 11. The plasma cleaning of the substrate 11 takes about 3 minutes (min) to about 10 min. The plasma cleaning process enhances the bond between the substrate 11 and the anti-corrosion layer 13.

The aluminum layer 131 is vacuum sputtered on the plasma cleaned substrate 11. Vacuum sputtering of the aluminum layer 131 is carried out in the vacuum chamber 21. The vacuum chamber 21 is heated to a temperature of about 100° C. to about 150° C. Ar is used as the sputtering gas and is fed into the vacuum chamber 21 at a flow rate of about 100 sccm to about 300 sccm. The aluminum targets 23 are supplied with electrical power of about 8 kw to about 13 kw. A negative bias voltage of about −50 V to about −200 V is applied to the substrate 11 and the duty cycle is from about 30% to about 80%. Deposition of the aluminum layer 131 takes about 10 min to about 30 min.

The aluminum oxide layer 133 is vacuum sputtered on the aluminum layer 131. Vacuum sputtering of the aluminum oxide layer 133 is carried out in the vacuum chamber 21. Oxygen ($O_2$) is used as the reaction gas and is fed into the vacuum chamber 21 at a flow rate of about 150 sccm to about 200 sccm. The flow rate of Ar, temperature of the vacuum chamber 21 and the negative bias voltage are the same as vacuum sputtering of the aluminum layer 131. Deposition of the aluminum oxide layer 133 takes about 30 min to about 60 min.

The decorative layer 15 is vacuum sputtered on the aluminum oxide layer 133. Vacuum sputtering of the decorative layer 15 is carried out in the vacuum chamber 21. Nitrogen is used as the reaction gas and is fed into the vacuum chamber 21 at a flow rate of about 20 sccm to about 150 sccm. Aluminum targets 23 are powered off and titanium or chromium targets 24 are supplied with electrical power of about 8 kw to about 10 kw. The flow rate of Ar, temperature of the vacuum chamber 21 and the negative bias voltage are the same as vacuum sputtering of the aluminum layer 131. Deposition of the decorative layer 15 takes about 20 min to about 30 min. The decorative layer 15 is a TiN or CrN layer.

When the coated article 10 is in a corrosive environment, the anti-corrosion layer 13 can slow down galvanic corrosion of the substrate 11 due to the low potential difference between the anti-corrosion layer 13 and the substrate 11. So the corrosion resistance of the coated article 10 is improved. The decorative layer 15 has stable properties and gives the coated article 10 a long lasting pleasing appearance.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A coated article, comprising:
   a substrate, the substrate being made of aluminum or aluminum alloy;
   an anti-corrosion layer formed on the substrate, the anti-corrosion layer comprising an aluminum layer directly formed on the substrate and an aluminum oxide layer directly formed on the aluminum layer.

2. The coated article as claimed in claim 1, wherein the aluminum layer has a thickness of about 1.0 μm to about 3.0 μm.

3. The coated article as claimed in claim 1, wherein the aluminum oxide layer has a thickness of about 0.5 μm to about 1.0 μm.

4. The coated article as claimed in claim 1, wherein the anti-corrosion layer is made by magnetron sputtering process.

5. The coated article as claimed in claim 1, wherein the coated article further comprises a decorative layer formed on the anti-corrosion layer.

6. The coated article as claimed in claim 5, wherein the decorative layer is a titanium nitride layer.

7. The coated article as claimed in claim 5, wherein the decorative layer is a chromium nitride layer.

8. The coated article as claimed in claim 5, wherein the decorative layer has a thickness of about 1.0 μm to about 3.0 μm.

9. The coated article as claimed in claim 5, wherein the decorative layer is made by magnetron sputtering process.

* * * * *